United States Patent [19]

Droopad et al.

[11] Patent Number: 5,907,792
[45] Date of Patent: May 25, 1999

[54] METHOD OF FORMING A SILICON NITRIDE LAYER

[75] Inventors: Ravi Droopad; Jonathan K. Abrokwah, both of Tempe; Matthias Passlack, Chandler; Zhiyi Jimmy Yu, Gilbert, all of Ariz.

[73] Assignee: Motorola, Inc., Schaumburg, Ill.

[21] Appl. No.: 08/917,122

[22] Filed: Aug. 25, 1997

[51] Int. Cl.$^6$ .................................. H01L 29/78
[52] U.S. Cl. .................... 438/791; 438/791; 438/961; 148/DIG. 169; 117/952; 117/108; 427/595
[58] Field of Search .................. 438/791, FOR 265, 438/961; 148/DIG. 169; 117/952, 108; 427/595

[56] References Cited

U.S. PATENT DOCUMENTS 4,800,100  1/1989  Herbots et al. ..................... 427/38
4,866,006  9/1989  Yokoi et al. ....................... 438/792

*Primary Examiner*—Charles Bowers
*Assistant Examiner*—Thanh Nguyen
*Attorney, Agent, or Firm*—Eugene A. Parsons; George C. Chen

[57] ABSTRACT

A method of forming a silicon nitride layer or film on a semiconductor wafer structure includes forming a silicon nitride layer on the surface of a wafer structure using a molecular beam of high purity elemental Si and an atomic beam of high purity nitrogen. In a preferred embodiment, a III–V compound semiconductor wafer structure is heated in an ultra high vacuum system to a temperature below the decomposition temperature of said compound semiconductor wafer structure and a silicon nitride layer is formed using a molecular beam of Si provided by either thermal evaporation or electron beam evaporation, and an atomic nitrogen beam provided by either RF or microwave plasma discharge.

14 Claims, 1 Drawing Sheet

METHOD OF FORMING A SILICON NITRIDE LAYER

FIELD OF THE INVENTION

The present invention pertains to methods of forming a silicon nitride layer on a supporting structure and more particularly to methods of forming a silicon nitride layer by a molecular/atomic beam technique in an ultra high vacuum.

BACKGROUND OF THE INVENTION

In the semiconductor art it is often desirable to form insulating layers or films on various supporting structures, such as gate insulators in field effect transistors, a passivation layer or protecting film covering various areas of electronic and optoelectronic devices, etc. Regardless of its use, it is imperative that the dielectric layer or film be a good insulator with low defect density to enable device operation and enhance device performance.

In prior art, insulating silicon nitride layers or films are routinely fabricated on Si substrate using chemical vapor deposition (CVD) techniques with silane (or dichlorosilane) and ammonia as source materials. The substrate is typically held at temperatures in excess of 700° C. for silicon nitride deposition to allow efficient cracking of the silane gas. The reaction occurring in the process depends on the gas used and is either,

$$3SiH_4 + 4NH_3 \rightarrow Si_3N_4 + 12H_2, \text{ or} \quad (1)$$

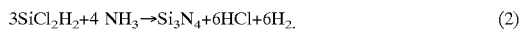

$$3SiCl_2H_2 + 4 NH_3 \rightarrow Si_3N_4 + 6HCl + 6H_2. \quad (2)$$

Prior art also describes the deposition of silicon nitride at low temperature (<400° C.) using plasma systems in which silane reacts with a nitrogen discharge from a radio frequency (RF) or electron cyclotron resonance (ECR) source to form a silicon nitride. Silicon nitride films or layers deposited using a low temperature CVD process are hydrogen rich; they may contain more than 10% hydrogen dependent on deposition technique and conditions. This is a serious problem for a gate insulator. Hydrogen acts as a trapping center for holes (bulk trap density $N_t > 10^{12}$ cm$^{-2}$) causing significant shift of device parameters such as threshold voltage and operating point. Further, the involvement of hydrogen in hot electron degradation and dielectric breakdown has been studied for decades. Degradation and subsequent breakdown are based on hot-electron-induced release of atomic hydrogen and subsequent hydrogen-induced defect generation leading to hydrogen induced build-up of fast interface states ($D_{it}$) and slow trap states (anomalous positive charge), see for instance J. H. Stathis et al., Proc. International Conf. on Solid State Devices and Materials, pp. 791–793, Yokohama, Japan (1996).

Further, prior art, for instance U.S. Pat. No. 5,256,205, entitled "Microwave Plasma Assisted Gas Jet Deposition of Thin Film Materials", issued Oct. 26, 1993, and U.S. Pat. No. 5,356,672 entitled "Method for Microwave Plasma Assisted Supersonic Gas Jet Deposition of Thin Films, issued Oct. 18, 1994, reported the fabrication of virtually hydrogen free nitride films with a low bulk trap density $N_t \leq 10^{11}$ cm$^{-2}$ using a jet vapor deposition process in which supersonic jets of the source gases are used to deposit a silicon nitride film or layer at room temperature. The described jet vapor deposition process for silicon nitride operates at a high pressure of ≅1 Torr.

For compound semiconductors such as GaAs, an amorphous insulating layer or film with low trap density ($N_t \leq 10^{11}$ cm$^{-2}$) and high dielectric constant (>3.9) is highly desirable for gate insulator applications. The insulating material such as silicon nitride can be directly deposited on a semiconductor wafer structure or alternatively, the silicon nitride film can be deposited on an amorphous oxide film which provides low interface state density $D_{it}$, on GaAs based semiconductors, see for example M. Passlack et al., Appl. Physics Lett., vol. 68, 1099 (1966). However, a high temperature deposition process is prohibitive on III–V (or even II–VI) compound semiconductor based structures (viz. the III-arsenides, III-phosphides, III-antimonides, II-tellurides among others) since compound semiconductors decompose at temperatures above 700° C. Further, a high pressure process (pressure $\geq 10^{-4}$ Torr) cannot be integrated into an ultra-high vacuum (UHV) system without using an additional buffer chamber and thus, said high pressure process is incompatible with III–V semiconductor growth and surface preparation schemes required for gate insulator and surface passivation applications.

Accordingly, it would be highly desirable to provide new methods of manufacturing which overcome these problems.

It is a purpose of the present invention to provide a new and improved method of fabricating a silicon nitride layer or film.

It is another purpose of the present invention to provide a new and improved method of fabricating a silicon nitride layer or film which has a significantly reduced level of hydrogen.

It is still another purpose of the present invention to provide a new and improved method of fabricating a silicon nitride layer or film with a low trap density $N_t \leq 10^{11}$ cm$^{-2}$.

It is yet another purpose of the present invention to provide a new and improved method of fabricating a silicon nitride layer or film which is compatible with a low temperature process.

It is a further purpose of the present invention to provide a new and improved method of fabricating a silicon nitride layer or film using a molecular beam of high purity elemental Si and an atomic beam of high purity nitrogen.

It is still a further purpose of the present invention to provide a new and improved method of fabricating a silicon nitride layer or film on a compound semiconductor wafer structure.

It is yet a further purpose of the present invention to provide a new and improved method of fabricating a silicon nitride layer or film which is compatible with the requirements of III–V compound semiconductor manufacturing.

It is still a further purpose of the present invention to provide a new and improved method of fabricating a silicon nitride layer or film which is compatible with the UHV requirements of compound semiconductor growth and surface preparation schemes applied to gate insulator and surface passivation applications.

It is yet a further purpose of the present invention to provide a new and improved method of fabricating a silicon nitride layer or film wherein the substrate deposition temperature is below the decomposition temperature of the compound semiconductor wafer structure.

It is still a further purpose of the present invention to provide a new and improved method of fabricating a silicon nitride layer wherein the silicon nitride layer is fabricated on a stoichiometric upper surface of a compound semiconductor wafer structure.

It is yet a further purpose of the present invention to provide a new and improved method of fabricating an insulator-semiconductor structure with improved stability and reliability.

It is still a further purpose of the present invention to provide a new and improved method of fabricating a silicon nitride layer or film on semiconductor wafer structure which is relatively easy to fabricate and use.

SUMMARY OF THE INVENTION

The above problems and others are at least partially solved and the above purposes and others are realized in a method of forming a silicon nitride layer or film on a semiconductor wafer structure including the steps of providing a semiconductor wafer structure with a surface and forming a silicon nitride layer on the surface of the wafer structure using a molecular beam of high purity elemental Si and an atomic beam of high purity nitrogen.

In a preferred embodiment, a III–V compound semiconductor wafer structure is heated in an ultra high vacuum system to a temperature below the decomposition temperature of said compound semiconductor wafer structure and a silicon nitride layer is formed using a molecular beam of Si provided by any one of thermal evaporation and electron beam evaporation, and an atomic nitrogen beam provided by any one of RF or microwave plasma discharge.

BRIEF DESCRIPTION OF THE DRAWINGS

Referring to the drawings.

DESCRIPTION OF THE PREFERRED EMBODIMENT

Figure 1:
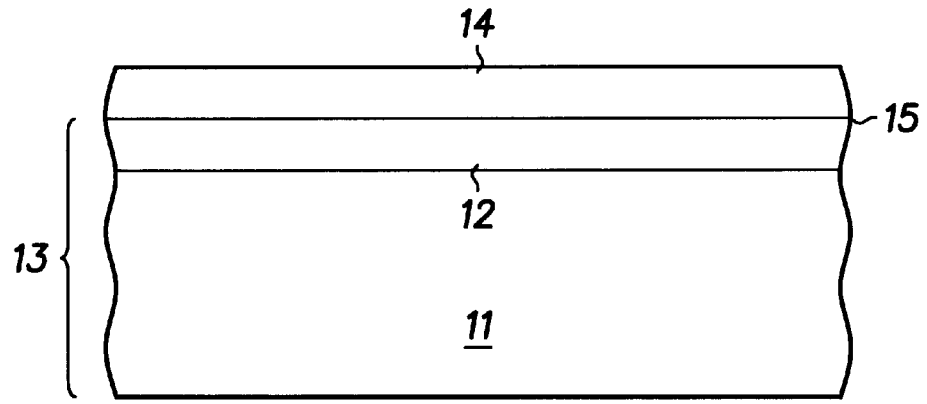
FIG. 1 is a simplified cross-sectional view of a compound semiconductor wafer structure with a silicon nitride layer in accordance with the present invention.

Referring specifically to FIG. 1, a simplified cross-sectional view of a semiconductor wafer structure 10 with a silicon nitride layer in accordance with the present invention is illustrated. Structure 10 includes a semiconductor material, such as any material employed in any semiconductor device, represented herein by a semiconductor substrate 11 and a layer structure 12. For purposes of this disclosure, the substrate, any epitaxial layers, and any amorphous layers formed thereon will be referred to simply as a semiconductor wafer structure which in FIG. 1 is designated 13. Semiconductor wafer structure 13 has an upper surface 15 onto which a silicon nitride layer 14 is positioned using a molecular/atomic beam technique. It will of course be understood that in some specific applications (or on some portions of compound semiconductor wafer structure 13) there may be no epitaxial layers and/or no amorphous layers present and upper surface 15 may simply be the upper surface of the substrate 11.

Figure 2:
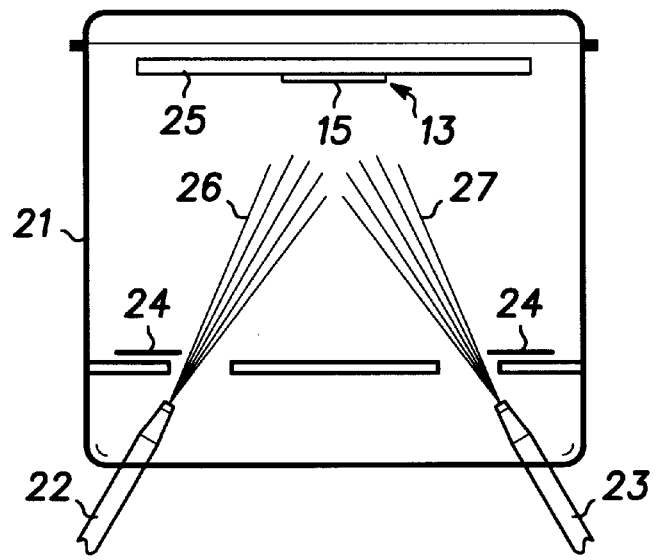
FIG. 2 illustrates a UHV molecular beam epitaxy system utilized in fabricating the structure of FIG. 1 in accordance with the present invention.

Referring now to FIG. 2, a UHV molecular beam epitaxy (MBE) system 20 is illustrated which is utilized in fabricating the structure of FIG. 1 in accordance with the present invention. System 20 includes a UHV chamber 21, a conventional Knudsen source 22, a plasma discharge device 23, cell shutters 24, and a substrate holder such as a platen 25. It will of course be understood that system 20 may also include other standard sources which are routinely used in MBE but which are not shown in FIG. 2, for instance effusion cells for Ga, As, Al, In, Ge etc.

In a specific embodiment, a compound semiconductor wafer structure 13 with an upper surface 15 is mounted onto substrate holder 25 and loaded into UHV chamber 21. The upper surface 15 of semiconductor wafer structure 13 may be provided by an epitaxial layer or an amorphous oxide film which gives low interface state density $D_{it}$ on GaAs based semiconductors. Subsequently, compound semiconductor wafer structure 13 is heated to a substrate deposition temperature below the decomposition temperature of said semiconductor wafer structure. A molecular beam of Si 26 is generated thermally using Knudsen cell 22, and an atomic beam of nitrogen 27 is provided by a commercially available RF plasma source 23. After opening the shutters 24, silicon beam 26 and nitrogen atomic beam 27 arrive on upper surface 15 of compound semiconductor wafer structure 13. Because the species arriving on the upper surface 15 of compound semiconductor wafer structure 13 are constituent atoms, no cracking is required as is the case of the CVD process. As a result the substrate deposition temperature could be as low as room temperature. Consequently, for silicon nitride deposition on a compound semiconductor wafer structure, a stoichiometric surface can be maintained at the start of silicon nitride deposition. A stoichiometer upper surface 15 of a compound semiconductor wafer structure 13 can also be more readily accomplished in an MBE system since the compound semiconductor epitaxial layers can be grown and the silicon nitride film can be subsequently deposited on the as-grown semiconductor surface 15 without having a problem of surface contamination which occurs when the upper surface 15 of compound semiconductor wafer structure 15 is exposed to atmosphere.

Another advantage of silicon nitride deposition according to the present invention is the absence of hydrogen which provides silicon nitride films with significantly reduced hydrogen level and consequently, lower trap density $N_t$. A further advantage of the proposed process is the elimination of ammonia and silane. Ammonia is very corrosive to such things as copper, nickel and viton o-ring seals. Silane on the other hand is highly explosive. Elimination of these gases is desirable in terms of cost for safety equipment and having to satisfy federal and local authorities for using such gases.

Thus, a new and improved method of manufacturing a silicon nitride layer on a semiconductor wafer structure using a molecular/atomic beam technique is disclosed. The new and improved method of manufacturing a silicon nitride layer or film is compatible with a low temperature process and provides silicon nitride with a significantly reduced level of hydrogen, and a low trap density. Further, the new and improved method of manufacturing a silicon nitride layer is compatible with the requirements of compound semiconductor manufacturing such as compound semiconductor growth and surface preparation schemes applied to gate insulator and surface passivation applications. These improvements essentially solve or overcome the problems of prior art such as dc instability and poor reliability of silicon nitride-semiconductor structures.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of forming a silicon nitride layer on a semiconductor wafer structure comprising the steps of:

providing a semiconductor wafer structure with a surface; and forming a silicon nitride layer on the surface of semiconductor wafer structure by depositing silicon nitride onto the wafer structure using a combination molecular beam and atomic beam technique to provide constituent atoms at the surface.

2. A method of forming a silicon nitride layer on a semiconductor wafer structure as claimed in claim 1 wherein the silicon nitride layer is formed using a molecular beam of elemental Si and an atomic beam of nitrogen.

3. A method of forming a silicon nitride layer on a semiconductor wafer structure as claimed in claim 1 wherein the step of providing a semiconductor wafer structure includes providing a structure with a compound semiconductor material having a decomposition temperature and the step of forming a silicon nitride layer is is performed at a temperature below the decomposition temperature of the compound semiconductor material.

4. A method of forming a silicon nitride layer on a semiconductor wafer structure as claimed in claim 1 wherein the step of forming the silicon nitride layer includes the formation of a silicon nitride layer with a reduced level of hydrogen.

5. A method of forming a silicon nitride layer on a semiconductor wafer structure as claimed in claim 1 wherein the step of forming the silicon nitride layer includes the formation of a silicon nitride layer with a low trap density $<10^{11}$ cm$^{-2}$.

6. A method of forming a silicon nitride layer on a semiconductor wafer structure as claimed in claim 1 wherein the step of providing the semiconductor wafer structure includes providing a semiconductor wafer with a semiconductor device or a semiconductor device structure formed thereon.

7. A method of forming a silicon nitride layer on a compound semiconductor wafer structure comprising the steps of:

providing a compound semiconductor wafer structure with a surface; and forming a silicon nitride layer on the surface of compound semiconductor wafer structure by depositing silicon nitride onto the wafer structure using a combination molecular beam and atomic beam technique to provide constituent atoms at the surface.

8. A method of forming a silicon nitride layer on a compound semiconductor wafer structure as claimed in claim 7 wherein the step of providing a compound semiconductor wafer structure includes providing a semiconductor wafer of GaAs.

9. A method of forming a silicon nitride layer on a compound semiconductor wafer structure as claimed in claim 7 wherein the step of providing a compound semiconductor wafer structure includes the growth of epitaxial compound semiconductor layers on the surface of a compound semiconductor wafer.

10. A method of forming a silicon nitride layer on a compound semiconductor wafer structure as claimed in claim 7 wherein the step of providing a compound semiconductor wafer structure includes the deposition of an amorphous layer on the surface of a compound semiconductor wafer structure.

11. A method of forming a silicon nitride layer or film on a compound semiconductor wafer structure as claimed in claim 7 wherein the step of forming a silicon nitride layer is compatible with the requirements of III–V compound semiconductors manufacturing.

12. A method of forming a silicon nitride layer or film on a compound semiconductor wafer structure as claimed in claim 7 wherein the step of forming a silicon nitride layer is compatible with the UHV temperature and pressure requirements of compound semiconductor growth and surface preparation schemes applied to gate insulator and surface passivation applications.

13. A method of forming a silicon nitride layer or film on a compound semiconductor wafer structure as claimed in claim 7 wherein the compound semiconductor wafer structure has a decomposition temperature and the substrate deposition temperature is below the decomposition temperature of the compound semiconductor wafer structure.

14. A method of forming a silicon nitride layer or film on a compound semiconductor wafer structure as claimed in claim 7 wherein the step of forming the silicon nitride layer includes the formation of a silicon nitride layer fabricated on a stoichiometric upper surface of a compound semiconductor wafer structure.

* * * * *